United States Patent
Lee et al.

(10) Patent No.: US 11,232,023 B2
(45) Date of Patent: Jan. 25, 2022

(54) CONTROLLER AND MEMORY SYSTEM INCLUDING THE SAME

(71) Applicant: SK hynix Inc., Gyeonggi-do (KR)

(72) Inventors: Joung Young Lee, Gyeonggi-do (KR); Dong Sop Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 29 days.

(21) Appl. No.: 16/800,599

(22) Filed: Feb. 25, 2020

(65) Prior Publication Data

US 2021/0026764 A1 Jan. 28, 2021

(30) Foreign Application Priority Data

Jul. 22, 2019 (KR) ........................ 10-2019-0088342

(51) Int. Cl.
*G06F 12/02* (2006.01)
*G06F 12/0882* (2016.01)
*G06F 9/30* (2018.01)
*G11C 7/10* (2006.01)
*G06F 12/0873* (2016.01)

(52) U.S. Cl.
CPC ...... *G06F 12/0246* (2013.01); *G06F 9/30145* (2013.01); *G06F 12/0873* (2013.01); *G06F 12/0882* (2013.01); *G11C 7/1084* (2013.01); *G06F 2212/7201* (2013.01)

(58) Field of Classification Search
None
See application file for complete search history.

(56) References Cited

U.S. PATENT DOCUMENTS

| | | | | |
|---|---|---|---|---|
| 2013/0024644 | A1* | 1/2013 | Givargis | G06F 3/0608 711/203 |
| 2015/0286581 | A1* | 10/2015 | Lee | G06F 3/0623 713/189 |
| 2016/0124649 | A1* | 5/2016 | Liu | G06F 3/061 711/103 |
| 2019/0146712 | A1* | 5/2019 | Lee | G06F 3/0659 711/103 |
| 2020/0097216 | A1* | 3/2020 | Marcu | G06F 3/0679 |
| 2020/0242263 | A1* | 7/2020 | Hajnoczi | G06F 9/5016 |
| 2020/0334159 | A1* | 10/2020 | Lee | G06F 12/0868 |

FOREIGN PATENT DOCUMENTS

KR 10-2017-0046862 5/2017
KR 10-2018-0054394 5/2018

* cited by examiner

*Primary Examiner* — Kevin Verbrugge
(74) *Attorney, Agent, or Firm* — IP & T Group LLP

(57) ABSTRACT

A controller and a memory system including the same are disclosed. The controller receives a write command for storing write data, which is stored in at least one among a plurality of memory regions included in a host memory, in a nonvolatile memory device, generates a host memory map table by mapping virtual addresses to host memory physical addresses corresponding to the at least one memory region, and transmits the write data stored in the at least one memory region to the nonvolatile memory device by converting the virtual addresses into the host memory physical addresses based on the host memory map table.

20 Claims, 11 Drawing Sheets

FIG.2A

| Physical Address | Host Memory |
|---|---|
| 0x20000000 | Region_0 |
|  | Region_1 |
| 0x20003000 |  |
|  | Region_2 |
| 0x20004000 |  |
| 0x2000AXXX | Region_3 |
| 0x2000BXXX | Region_4 |
| 0x2000CXXX | Region_5 |
|  | Region_6 |
| 0x2000EXXX |  |
| 0x2000FXXX | Region_7 |
|  | Region_8 |
|  | Region_9 |
|  | Region_10 |
| 0x200AFXXX |  |
|  | Region_11 |

FIG.2B

| Host Memory | | index |
|---|---|---|
| Region_0 | |  |
| Region_1 | |  |
|  | sub_0 | 0 |
| Region_2 | sub_1 | 1 |
|  | sub_2 | 2 |
| Region_3 | | 3 |
| Region_4 | sub_3 | 4 |
| Region_5 | | 5 |
| Region_6 | sub_4 | 6 |
|  | sub_5 | 7 |
| Region_7 | | 8 |
| Region_8 | sub_6 | 9 |
| Region_9 | | 10 |
|  | sub_7 | 11 |
| Region_10 | sub_8 | 12 |
|  | sub_9 | 13 |
|  | sub_10 | 14 |
| Region_11 | |  |

FIG.2C

| Host Memory | | index | Virtual Address |
|---|---|---|---|
| | sub_0 | 0 | 0 |
| Region_2 | sub_1 | 1 | 1 |
| | sub_2 | 2 | 2 |
| Region_4 | sub_3 | 4 | 3 |
| Region_6 | sub_4 | 6 | 4 |
| | sub_5 | 7 | 5 |
| Region_8 | sub_6 | 9 | 6 |
| | sub_7 | 11 | 7 |
| Region_10 | sub_8 | 12 | 8 |
| | sub_9 | 13 | 9 |
| | sub_10 | 14 | 10 |

FIG.2D

| Virtual Address | Physical Address (index) |
|---|---|
| 0 | 0 |
| 1 | 1 |
| 2 | 2 |
| 3 | 4 |
| 4 | 6 |
| 5 | 7 |
| 6 | 9 |
| 7 | 11 |
| 8 | 12 |
| 9 | 13 |
| 10 | 14 |

# CONTROLLER AND MEMORY SYSTEM INCLUDING THE SAME

CROSS-REFERENCE TO RELATED APPLICATION

The present application claims priority under 35 U.S.C. § 119(a) to Korean application number 10-2019-0088342, filed on Jul. 22, 2019, in the Korean Intellectual Property Office, which is incorporated herein by reference in its entirety.

BACKGROUND

1. Technical Field

Various embodiments may generally relate to a semiconductor device, and more particularly, to a controller and a memory controller including the same.

2. Related Art

In recent years, the paradigm for computer environments changed to ubiquitous computing in which computer systems may be used anytime and anywhere. As a result, the use of portable electronic devices such as mobile phones, digital cameras, and laptop computers has rapidly increased. Generally, any such portable electronic device uses a memory system that employs a memory device to store data.

A memory system using a memory device has no mechanical driver, and thus exhibits good stability and endurance, fast information access, and low power consumption. Examples of such a memory system include a universal serial bus (USB) memory device, a memory card having various interfaces, a universal flash storage (UFS) device, and a solid state drive (SSD).

SUMMARY

Embodiments are provided to technology capable of improving performance of a memory system using a host memory.

In an embodiment of the present disclosure, a memory system may include: a nonvolatile memory device; and a controller configured to control the nonvolatile memory device. The controller is further configured to receive a write command for storing write data, currently stored in at least one among a plurality of memory regions in a host memory, in the nonvolatile memory device, generate a host memory map table by mapping virtual addresses to host memory physical addresses corresponding to the at least one memory region, and transmit the write data to the nonvolatile memory device from the host memory based on the host memory map table.

In an embodiment of the present disclosure, a controller may include: a first interface configured to perform data communication with a host; a second interface configured to perform data communication with a nonvolatile memory device; and a processor configured to control operations of the first and second interfaces. The first interface may receive, from a host, a write command for storing write data, which is currently stored in at least one among a plurality of memory regions in a host memory. The processor generates access information corresponding to host memory physical addresses which respectively correspond to a plurality of sub memory regions within the at least one memory region, each of the plurality of sub memory regions having a set size, in response to the received write command is divided by a preset size, in response to the received write command. The second interface may transmit the write data to the nonvolatile memory device from the host memory based on the access information.

In an embodiment of the present disclosure, a controller may include: a first interface configured to receive, from a host, a write command for storing write data, which is currently stored in at least one among a plurality of memory regions in a host memory; a first processor configured to generate a host memory map table by mapping virtual addresses to host memory physical addresses corresponding to the at least one memory region; a second interface configured to transmit the write data stored in the at least one memory region to the nonvolatile memory device; and a second processor configured to control the second interface to access the at least one memory region based on the host memory map table.

In an embodiment of the present disclosure, an operating method of a controller may include receiving, from a host, addresses corresponding to data buffered within the host; sequentially arranging the addresses; and controlling a memory device to sequentially store therein the buffered data by transferring, based on the arranged addresses, the buffered data directly from the host to the memory device.

According to an embodiment of the present disclosure, the performance of a memory system using a host memory can be improved.

These and other features, aspects, and embodiments are described below.

BRIEF DESCRIPTION OF THE DRAWINGS

The above and other aspects, features and advantages of the subject matter of the present disclosure will be more clearly understood from the following detailed description taken in conjunction with the accompanying drawings, in which:

FIGS. 2A to 2D and FIGS. 3 to 6 are diagrams explaining an operation of a memory system according to an embodiment of the present disclosure;

DETAILED DESCRIPTION

Various embodiments of the present invention are described in greater detail below with reference to the accompanying drawings. The description and drawings are directed to exemplary configurations and arrangements of the present invention and are not intended to limit the present invention. Rather, the present invention may be configured or arranged differently than any of the disclosed embodiments, as those skilled in the art will understand in light of the present disclosure. All such modifications and variations that do not depart from the spirit and scope of the invention are intended to be part of the invention.

Throughout the specification, reference to "an embodiment," "another embodiment" or the like is not necessarily to only one embodiment, and different references to any such phrase are not necessarily to the same embodiment(s). Similarly, reference to an element in the singular form does not preclude multiple instances of that element, unless stated or the context indicates otherwise. To that end, the indefinite articles "a" and "an" generally mean one or more, unless stated or the context indicates that only one is intended.

Figure 1:
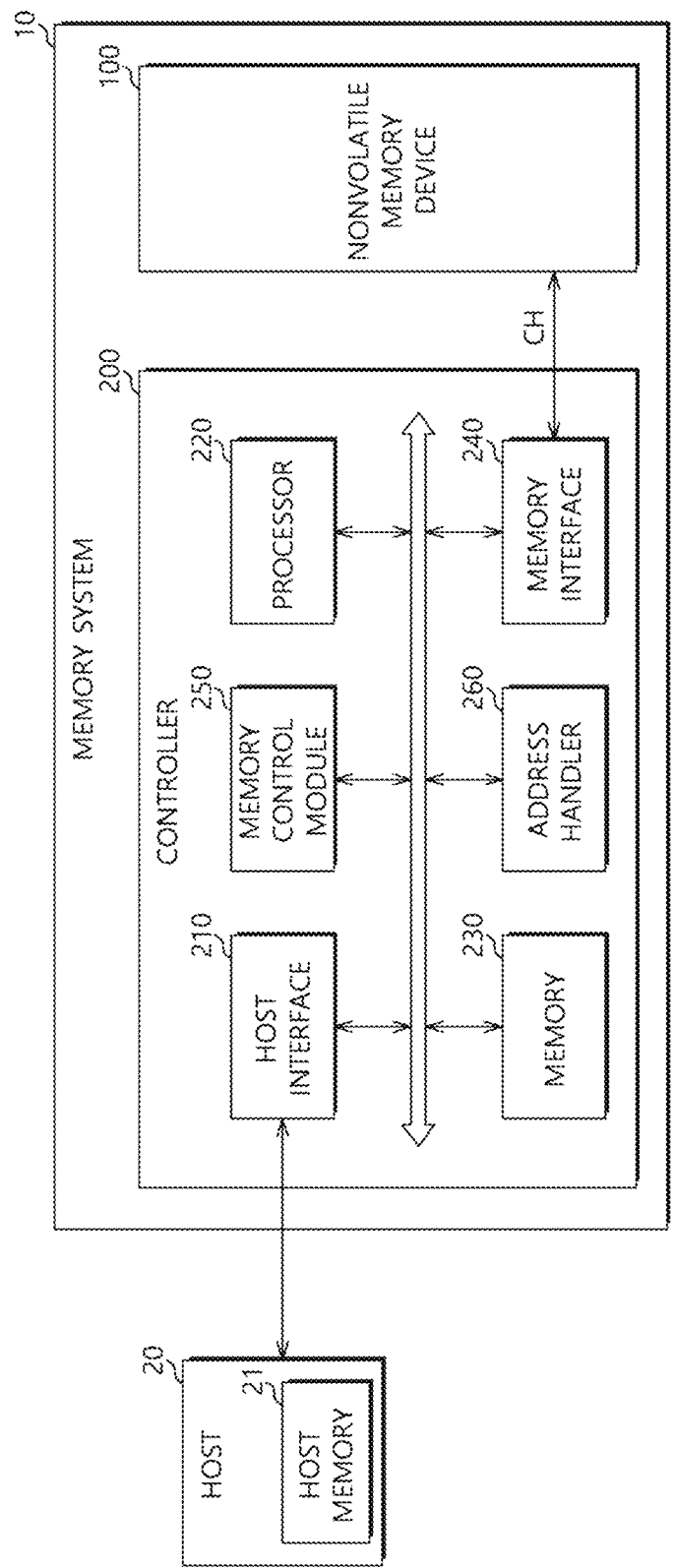
FIG. 1 is a diagram illustrating a configuration of a memory system according to an embodiment of the present disclosure.

FIG. 1 is a diagram illustrating a configuration of a memory system 10 according to an embodiment.

Referring to FIG. 1, the memory system 10 may store data to be accessed by a host 20, which may be, for example, a mobile phone, an MP3 player, a laptop computer, a desktop computer, a game player, a television (TV), and/or an in-vehicle infotainment system.

The memory system 10 may be configured as any of various types of storage devices according to an interface protocol coupled to the host 20. For example, the memory system 10 may be configured as a solid state drive (SSD), a multimedia card in the form of MMC, eMMC, RS-MMC, and micro-MMC, a secure digital card in the form of SD, mini-SD, and micro-SD, a universal serial bus (USB) storage device, a universal flash storage (UFS) device, a personal computer memory card international association (PCMCIA) card type storage device, a peripheral component interconnection (PCI) card type storage device, a PCI-express (PCI-E) card type storage device, a compact flash (CF) card, a smart media card, and/or a memory stick.

The memory system 10 may be manufactured as any of various types of packages. For example, the memory system 10 may be manufactured as a package on package (POP), a system in package (SIP), a system on chip (SOC), a multichip package (MCP), a chip on board (COB), a wafer-level fabricated package (WFP), and/or a wafer-level stack package (WSP).

The memory system 10 may include a nonvolatile memory device 100 and a controller 200.

The nonvolatile memory device 100 may be operated as a storage medium of the memory system 10. The nonvolatile memory device 100 may include any of various types of nonvolatile memory devices according to the type of memory cells of the device, such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase-change random access memory (PRAM) using a chalcogenide alloy, and/or a resistive random access memory (ReRAM) using a transition metal compound.

Although it has been illustrated in FIG. 1 that the memory system 10 includes one nonvolatile memory device 100, such representation is for clarity. In another embodiment, the memory system 10 may include a plurality of nonvolatile memory devices 100 that may be configured and operated consistent with the teachings herein.

The nonvolatile memory device 100, which is described below in more detail with reference to FIG. 12, may include a memory cell array 110 including a plurality of memory cells MC arranged in regions at which a plurality of word lines WL1 to WLm and a plurality of bit lines BL1 to BLn intersect. The memory cell array may include a plurality of memory blocks, each of which may include a plurality of pages.

For example, each of the memory cells in the memory cell array may be a single-level cell (SLC) in which a single bit data (for example, 1-bit data) is to be stored or a multi-level cell (MLC) in which 2-bit or more data is to be stored. The MLC may store 2-bit data, 3-bit data, 4-bit data, and the like. In a more specific context, the MLC may refer to a memory cell in which 2-bit data is to be stored, in which case a memory cell in which 3-bit data is to be stored may be referred to as a triple-level cell (TLC), and a memory cell in which 4-bit data is to be stored may be referred to as a quad-level cell (QLC). Below, MLC is used in the more general sense to refer to any memory cells in which 2 or more bits of data are to be stored.

The memory cells in the memory cell array 110 may be arranged in a two-dimensional (2D) horizontal structure or in a 3D vertical structure.

The controller 200 may control overall operation of the memory system 10 through driving of firmware or software loaded into a memory 230. The controller 200 may decode and drive a code-type instruction or algorithm such as firmware or software. The controller 200 may be implemented with hardware or a combination of hardware and software.

The controller 200 may include a host interface 210, a processor 220, the memory 230, a memory interface 240, a memory control module 250, and an address handler 260. Although not shown in FIG. 1, the controller 200 may further include an error correction code (ECC) engine which generates parity information by performing ECC encoding on write data provided from the host 20 and performs ECC decoding on read data read out from the nonvolatile memory device 100 using the parity information.

The controller 200 may not store the write data, which is stored in the host memory 21, and instead may transmit the write data to the nonvolatile memory device 100. For example, the controller 200 may receive the write command from the host 20. The controller 200 may generate the host memory map table, in which the host memory physical addresses of the host memory 21 are mapped to the virtual addresses, in response to the received write command, wherein the write data are stored at the physical addresses of the host memory 21. The controller 200 may access the host memory 21 by converting the virtual addresses into the host memory physical addresses based on the host memory map table and transmit the write data stored in the host memory 21 to the nonvolatile memory device 100. The host memory map table may be access information for allowing the memory system to access the host memory where the write data is stored.

The host interface 210 may serve as an interface between the host 20 and the memory system 10 according to a protocol of the host 20. For example, the host interface 210 may communicate with the host 20 through any of various protocols including a USB protocol, a UFS protocol, an MMC protocol, a parallel advanced technology attachment (PATA) protocol, a serial advanced technology attachment (SATA) protocol, a small computer system interface (SCSI) protocol, a serial attached SCSI (SAS) protocol, a PCI protocol, and a PCI-E protocol.

The processor 220 may be configured as a micro control unit (MCU) and/or a central processing unit (CPU). The processor 220 may process requests transmitted from the host 20. To process such requests, the processor 220 may drive a code-type instruction or algorithm (for example, firmware) loaded into the memory 230 and control internal function blocks such as the host interface 210, the memory 230, and the memory interface 240 and the nonvolatile memory device 100.

The processor 220 may generate control signals for controlling operations of the nonvolatile memory device 100 based on the requests transmitted from the host 20 and provide the generated control signals to the nonvolatile memory device 100 through the memory interface 240.

The memory 230 may be configured as a random access memory such as a dynamic random access memory (DRAM) or a static random access memory (SRAM). The memory 230 may store the firmware driven through the processor 220. The memory 230 may also store data (for example, metadata) for driving of the firmware. For example, the memory 230 may be operated as a working memory of the processor 220.

In an embodiment, the memory 230 may include regions for various purposes such as a region in which a flash translation layer (FTL) is to be stored, a region used as a command queue (CMDQ) for queuing commands corresponding to requests provided from the host 20, a region used as a write data buffer in which write data is to be temporarily stored, a region used as a read data buffer in which read data is to be temporarily stored, and a region used as a map cache buffer in which map data is to be cached.

The memory interface 240 may control the nonvolatile memory device 100 according to control of the processor 220. The memory interface 240 may refer to a memory controller. The memory interface 240 may provide control signals to the nonvolatile memory device 100 through a channel CH. The control signals may include a command, an address, and an operation control signal, and the like for controlling the nonvolatile memory device 100. The memory interface 240 may provide data stored in the data buffer to the nonvolatile memory device 100 or store data transmitted from the nonvolatile memory device 100 in the data buffer.

The memory control module 250 may access the memory 230 and the host memory 21 for data processing according to a command from the processor 220. For example, the memory control module 250 may access the memory 230 and process the data of the memory 230 when an access address included in the command of the processor 220 is an address of the memory 230.

The memory control module 250 may access the host memory 21 by converting virtual addresses into host memory physical addresses based on the host memory map table and transmit the write data stored in the host memory 21 to the nonvolatile memory device 100.

The address handler 260 may generate, in response to a write command received from the host 20, the host memory map table by mapping the virtual addresses to the host memory physical addresses of memory regions storing the write data in the host memory 21.

In an embodiment, the address handler 260 may convert the virtual addresses into the host memory physical addresses of the host memory 21, based on the host memory map table, in response to a write data access request and the virtual addresses from the memory control module 250.

In an embodiment, the address handler 260 may be located between the memory control module 250 and the host interface 210.

The configuration of the controller 200 in FIG. 1 is merely exemplary. Other configurations consistent with the teachings herein may be used. Moreover, as those skilled in the art will understand, the controller 200 may include one or more additional components.

FIGS. 2A to 2D are diagrams explaining an operation of a memory system according to an embodiment.

The host memory and the host memory map tables generated through the memory system 10 are illustrated in FIGS. 2A to 2D.

For example, FIG. 2A illustrates an example in which write data are stored in the host memory 21. The host memory 21 may include a plurality of memory regions, for example, Region_0 to Region_11. The write data may be stored in at least one memory region, for example, Region_2, Region_4, Region_6, Region_8, and Region_10 among the plurality of memory regions Region_0 to Region_11 in the host memory 21. The write command may include addresses of the memory regions storing the write data and size information of the write data. According to an embodiment, at least one of the plurality of memory regions in the host memory 21 may have a different size than each of the other memory regions.

FIG. 2B illustrates an example in which some of the plurality of memory regions in the host memory 21 include one or more sub memory regions, each having a set size. The set size may be a data size unit to be processed in the memory system 10. For example, when the memory system 10 processes data in 4K units, the set size may be 4K.

In an embodiment, the memory system 10 may identify the memory regions having sub memory regions in terms of the sub regions. As exemplified in FIGS. 2A and 2B, when the host 20 provides information on the host memory physical addresses indicating that write data is stored in Regions_2, 4, 6, 8 and 10, the memory system 10 may identify the write data as stored in the sub memory regions sub_0 to sub_10 of those Regions.

In an embodiment, the memory system 10 may identify the sub memory regions with reference to a particular host memory physical address of the host memory. For example, the memory system 10 may identify the sub memory regions with reference to the lowest host memory physical address among the host memory physical addresses corresponding to the plurality of memory regions stored with the write data.

The memory system 10 may set indexes (for example, virtual indexes) to the host memory physical addresses of the sub memory regions sub_0 to sub_10 stored with the write data, and map the virtual addresses to the set indexes.

In an embodiment, each of the virtual addresses may be a linear address.

In an embodiment, the virtual addresses may have the same format as the addresses of the memory 230 included in the controller 200.

In an embodiment, the indexes may be set based on the lowest host memory physical address among the host memory physical addresses corresponding to the plurality of memory regions stored with the write data.

In an embodiment, the indexes may be offset values of the physical addresses within the host memory 21. For example, the memory system 10 may set the indexes of the plurality of sub memory regions sub_0 to sub_10 stored with the write data with reference to the lowest host memory physical address, which is the host memory physical address of the sub memory region sub_0 among the host memory physical addresses of the plurality of sub memory regions sub_0 to sub_10 stored with the write data. The lowest host memory physical address or the host memory physical address of the sub memory region sub_0 may become a base address for the offset values of the sub memory regions sub_0 to sub_10 stored with the write data. The base address may correspond to an offset value of 0.

FIG. 2C illustrates an example in which the virtual addresses are mapped to the indexes. For example, the memory system 10 may map the virtual addresses to the indexes set to the sub memory regions sub_0 to sub_10 stored with the write data.

FIG. 2D illustrates an example of a host memory map table in which the virtual addresses are mapped to the indexes. For example, the memory system 10 may generate the host memory map table in which the virtual addresses are mapped to the indexes representing the plurality of sub memory regions stored with the write data. In this example, the memory system 10 may access the host memory 21 stored with the write data by converting the virtual addresses into the host memory physical addresses of the host memory 21 using the host memory map table.

In an embodiment, the memory system 10 may store the host memory map table in the memory 230 of the controller 200.

Figure 3:
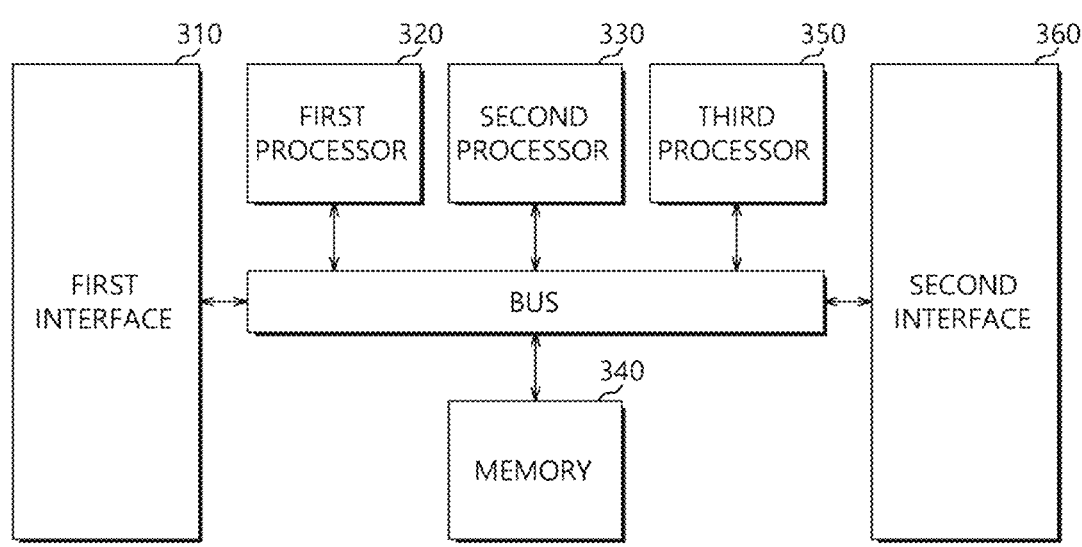

FIG. 3 is a diagram for explaining an operation of a controller according to an embodiment.

Referring to FIG. 3, the controller 200 may include a first interface 310, a first processor 320, a second processor 330, a memory 340, a third processor 350, and a second interface 360, which correspond respectively to the host interface 210, the address handler 260, the processor 220, the memory 230, the memory control module 250 and the memory interface 240 described with reference to FIGS. 1 to 2D.

The first interface 310 may perform data communication with the host 20. For example, the first interface 310 may receive the write command from the host 20. The first interface 310 may transmit the received write command to the second processor 330 through a bus.

The second processor 330 may control the first processor 320 to generate the host memory map table in response to the received write command.

The second processor 330 may allocate at least one data storage region, in which the write data is to be stored, among the plurality of data storage regions in the nonvolatile memory device 100, in response to the received write command. For example, the second processor 330 may allocate the data storage region(s) in which the write data is to be stored based on the size information of the write data included in the write command. The second processor 330 may map the allocated data storage region(s) to a logical address in the write command.

The first processor 320 may generate the host memory map table. For example, the first processor 320 may generate the host memory map table by mapping the virtual addresses to the host memory physical addresses stored with the write data within the host memory 21, based on information of the host memory physical addresses and the size of the write data, the information being included in the write command.

In an embodiment, the first processor 320 may store the host memory map table in the memory 340.

The first processor 320 may convert the virtual addresses into the host memory physical addresses of the host memory 21. For example, when the at least one data storage region in which the write data is to be stored is allocated within the nonvolatile memory device 100 by the second processor 330, the first processor 320 may convert the virtual addresses into the host memory physical addresses based on the host memory map table and transmit the host memory physical addresses to the third processor 350 through the bus.

The third processor 350 may transmit the write data from the host memory 21 to the nonvolatile memory device 100. For example, the third processor 350 may access the host memory 21 stored with the write data based on the host memory physical address, read the write data from the host memory 21, and transmit the write data to the nonvolatile memory device 100.

In an embodiment, the third processor 350 may read the write data in units of data size to be processed in the nonvolatile memory device 100.

The second interface 360 may perform data communication between the controller 200 and the nonvolatile memory device 100. For example, the second interface 360 may transmit the write data read from the host memory through the third processor 350 to the nonvolatile memory device 100.

Figure 4:
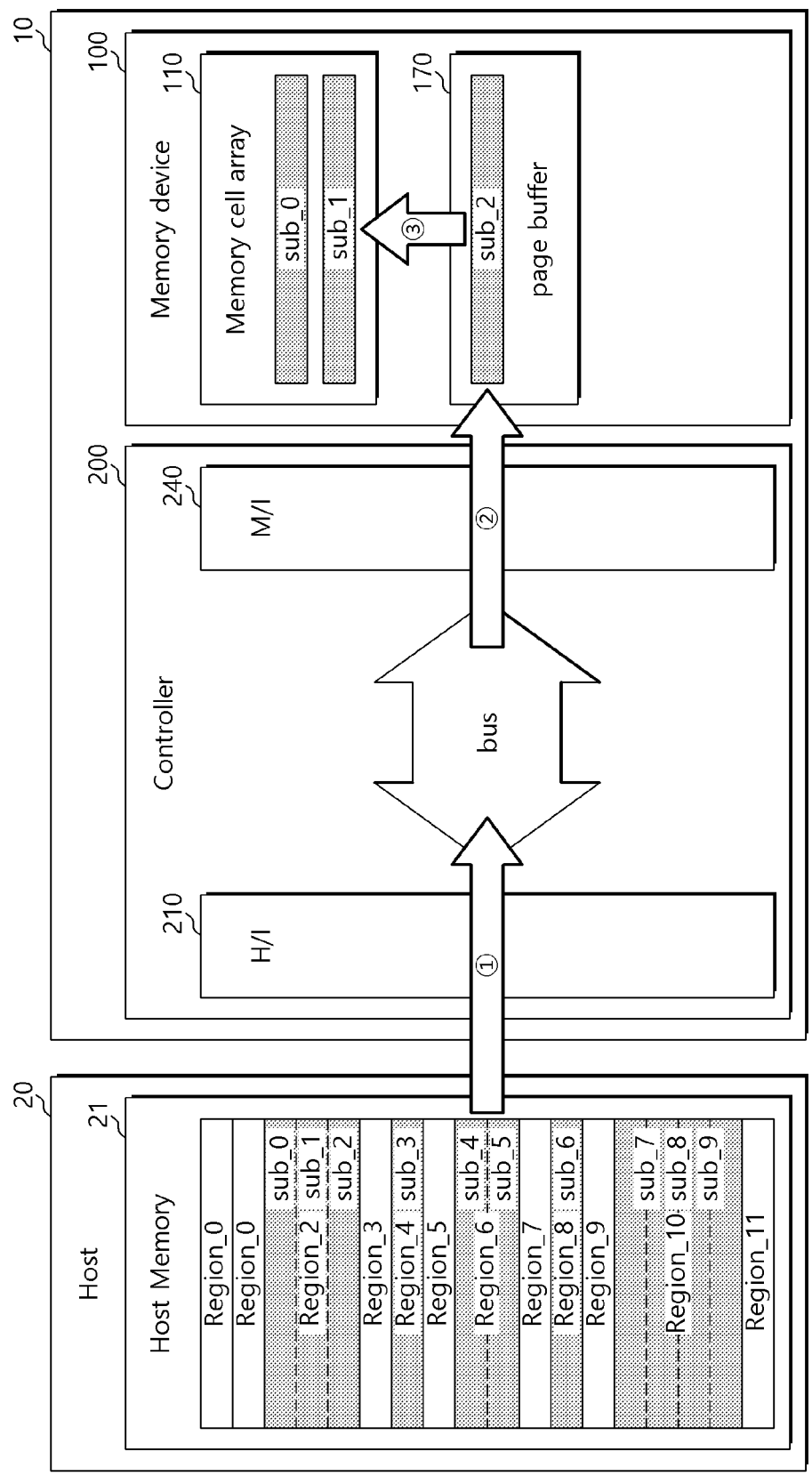

FIG. 4 is a diagram for explaining an operation of a memory system according to an embodiment.

Referring to FIG. 4, the controller 200 may access the sub memory regions stored with the write data among the plurality of sub memory regions in the host memory 21, using the host memory physical addresses of the host memory 21 into which the virtual addresses are converted based on the host memory map table, read the write data stored in sub memory regions of the host memory 21, and receive the read write data through the host interface 210 (①). The controller 200 may transmit the write data to a page buffer 170 included in the nonvolatile memory device 100 through the memory interface 240 (②). The nonvolatile memory device 100 may store the write data temporarily stored in the page buffer 170 in the memory cell array 110 (③).

In an embodiment, the controller 200 may read the write data from the host memory 21 in units of data size to be processed in the nonvolatile memory device 100, for example, in units of data size to be temporarily stored in the page buffer 170, and transmit the read write data to the nonvolatile memory device 100.

Figure 5:
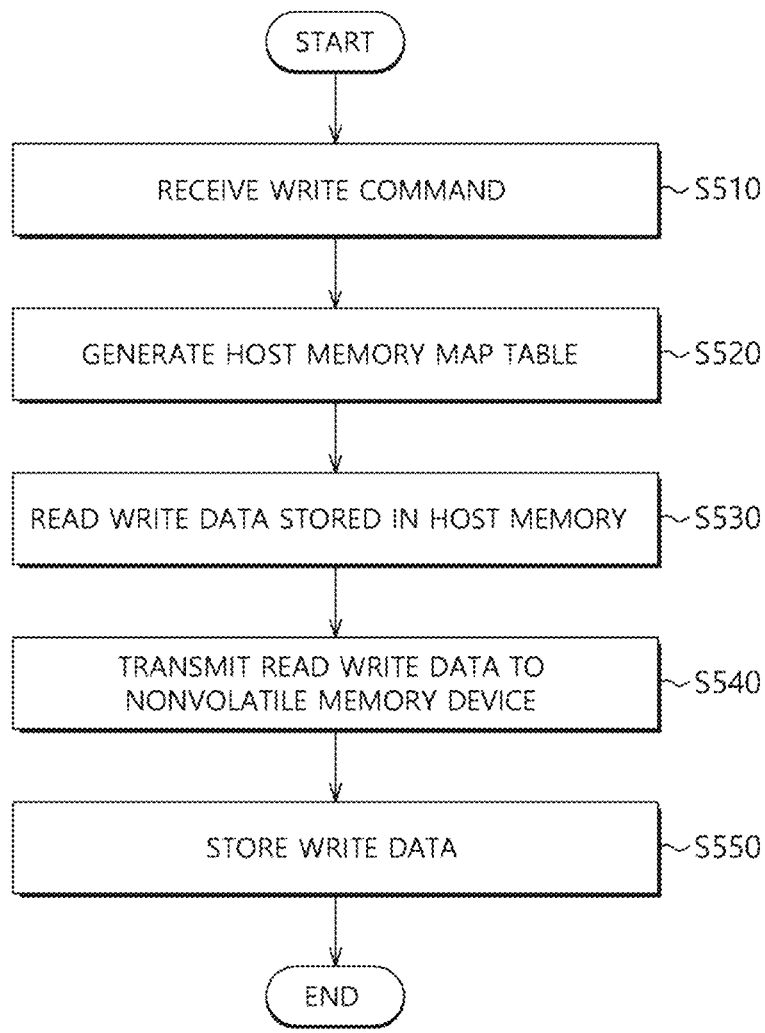

FIG. 5 is a diagram for explaining an operation method of a memory system according to an embodiment.

Referring to FIG. 5, in operation S510, the memory system 10 may receive a write command. For example, the controller 200 may receive the write command, which includes the address information (i.e., the information of the host memory physical addresses) of the host memory 21 stored with the write data, the size of the write data, an logical address in which the write data is to be stored, and the like, from the host 20.

In operation S520, the memory system 10 may generate the host memory map table by mapping the host memory physical addresses of the host memory 21 stored with the write data to the virtual addresses of the memory control module 250.

In operation S530, the memory system 10 may read the write data from the host memory 21 based on the virtual addresses. For example, the controller 200 may convert the virtual addresses into the host memory physical addresses of the host memory 21 based on the host memory map table and read the write data stored in the host memory 21 using the host memory physical addresses.

In operation S540, the memory system 10 may transmit the write data to the nonvolatile memory device 100. For example, the controller 200 may transmit the write data read from the host memory 21 to the nonvolatile memory device 100. In this example, the controller 200 may not store the write data read from the host memory 21 in the memory 230 and instead may transmit the write data to the nonvolatile memory device 100.

In an embodiment, the controller 200 may transmit the write data stored in the host memory 21 to the nonvolatile memory device 100. For example, the controller 200 may read the write data stored in the host memory 21 and directly transmit the write data to the nonvolatile memory device 100 without a buffer operation which stores the write data in the memory 230.

In operation S550, the memory system 10 may store the write data. For example, the nonvolatile memory device 100 may receive the write data from the controller 200, temporarily store the write data in the page buffer 170, and store the write data stored in the page buffer 170 in the memory cell array 110.

Figure 6:
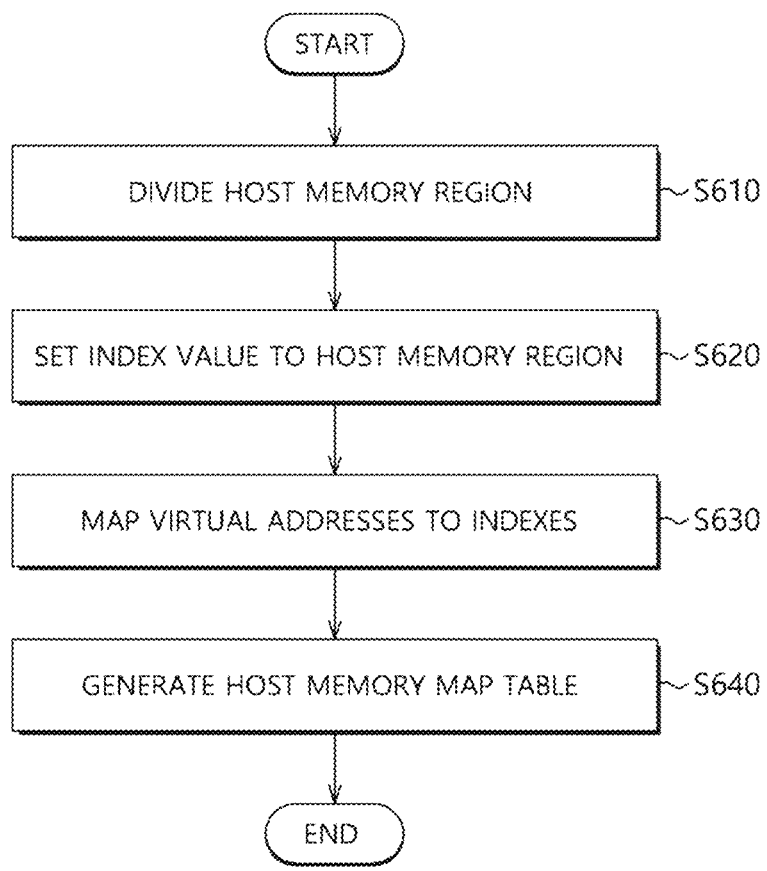

FIG. 6 is a diagram illustrating an operation method of a memory system according to an embodiment.

Referring to FIG. 6, in operation S610, the memory system 10 may identify a memory region of the host memory 21. For example, the controller 200 may identify each of the plurality of memory regions in the host memory 21 by a set size. In this example, the set size may be a data size unit to be processed in the memory system 10.

In an embodiment, the controller 200 may identify, as a plurality of sub memory regions, each having the set size, each of the plurality of memory regions stored with the write data within the host memory 21.

In operation S620, the memory system 10 may set indexes to the host memory regions. For example, the controller 200 may set the indexes to the host memory physical addresses of the sub memory regions stored with the write data among the plurality of sub memory regions.

In an embodiment, the indexes may be offset values of the sub memory regions. For example, the controller 200 may set the offset values as the indexes on the basis of the lowest host memory physical address among the host memory physical addresses corresponding to the sub memory regions stored with the write data.

In an embodiment, the offset values may be set as the indexes on the basis of the lowest host memory physical address among the host memory physical addresses of the host memory 21.

In operation S630, the memory system 10 may map the virtual addresses to the indexes. For example, the controller 200 may map the virtual addresses to the indexes which are set to the sub memory regions stored with the write data.

In an embodiment, each of the virtual addresses may be a linear address.

In an embodiment, the virtual addresses may have the same format as the addresses of the memory 230 included in the controller 200.

In operation S640, the memory system 10 may generate the host memory map table in which the virtual addresses are mapped to the host memory physical addresses of the host memory 21. For example, the controller 200 may generate the host memory map table in which the virtual addresses are mapped to the indexes which are set to the sub memory regions stored with the write data.

In an embodiment, the controller 200 may store the host memory map table in the address handler 260 or the memory 230.

Figure 7:
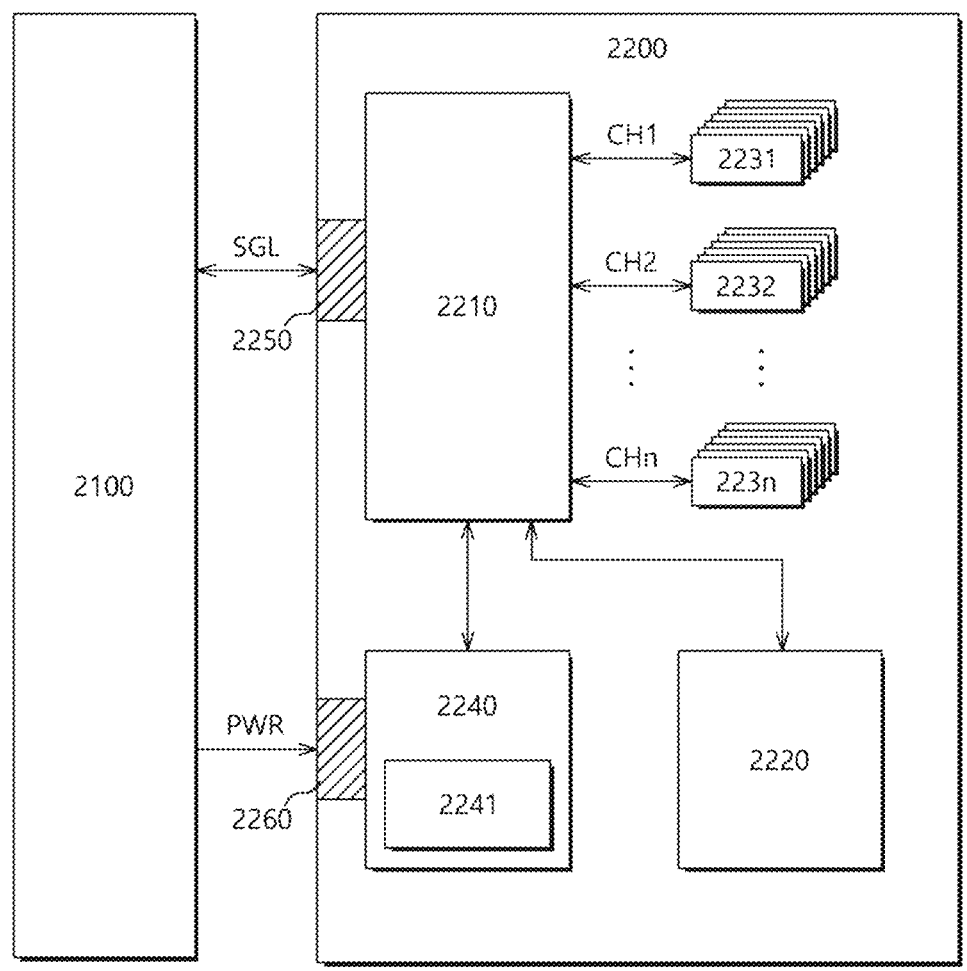
FIG. 7 is a diagram illustrating a data processing system including a solid state drive (SSD) according to an embodiment of the present disclosure.

FIG. 7 is a block diagram illustrating a data processing system including a solid state drive (SSD) according to an embodiment. Referring to FIG. 7, a data processing system 2000 may include a host 2100 and a solid state drive (SSD) 2200.

The SSD 2200 may include a controller 2210, a buffer memory device 2220, nonvolatile memory devices 2231 to 223n, a power supply 2240, a signal connector 2250, and a power connector 2260.

The controller 2210 may control overall operation of the SSD 2200.

The buffer memory device 2220 may temporarily store data which are to be stored in the nonvolatile memory devices 2231 to 223n. Further, the buffer memory device 2220 may temporarily store data which are read out from the nonvolatile memory devices 2231 to 223n. The data temporarily stored in the buffer memory device 2220 may be transmitted to the host 2100 or the nonvolatile memory devices 2231 to 223n according to control of the controller 2210.

The nonvolatile memory devices 2231 to 223n may be used as storage media of the SSD 2200. The nonvolatile memory devices 2231 to 223n may be coupled with the controller 2210 through a plurality of channels CH1 to CHn, respectively. One or more nonvolatile memory devices may be coupled to one channel. The nonvolatile memory devices coupled to one channel may be coupled to the same signal bus and data bus.

The power supply 2240 may provide power PWR inputted through the power connector 2260 to the inside of the SSD 2200. The power supply 2240 may include an auxiliary power supply 2241. The auxiliary power supply 2241 may supply power to allow the SSD 2200 to be properly terminated when sudden power-off (SPO) occurs. The auxiliary power supply 2241 may include large capacity capacitors capable of charging the power PWR.

The controller 2210 may exchange a signal SGL with the host 2100 through the signal connector 2250. The signal SGL may include a command, an address, data, and the like. The signal connector 2250 may be configured as any various types of connectors according to an interface scheme between the host 2100 and the SSD 2200.

Figure 8:
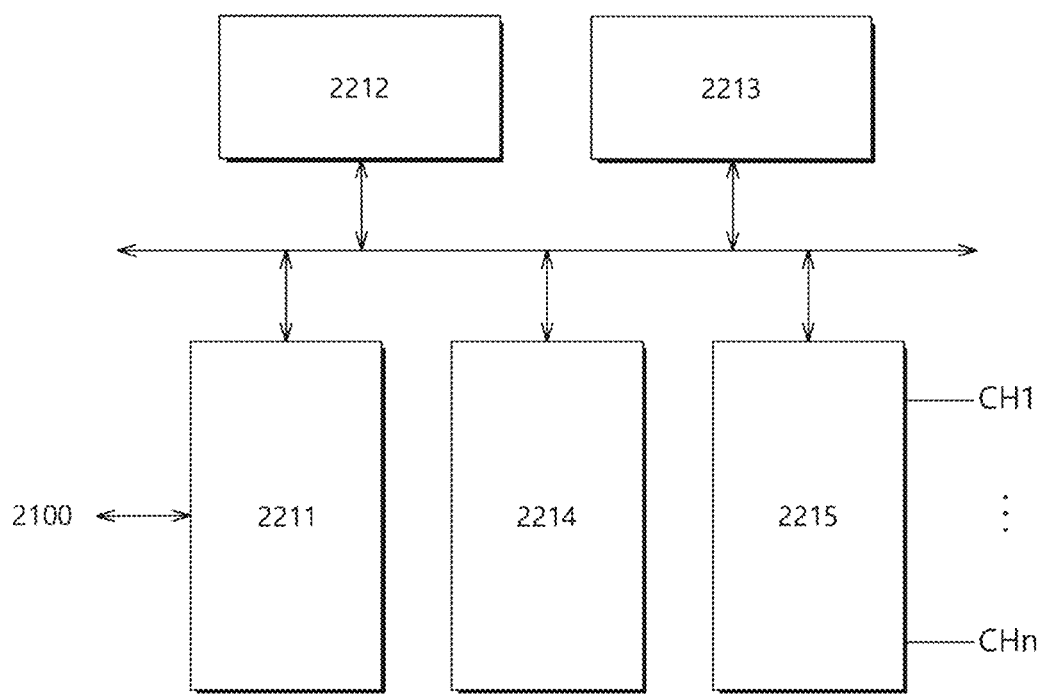
FIG. 8 is a diagram illustrating a configuration of a controller, such as that illustrated in FIG. 7.

FIG. 8 is a block diagram illustrating the controller illustrated in FIG. 7. Referring to FIG. 8, the controller 2210 may include a host interface 2211, a control component 2212, a random access memory 2213, an error correction code (ECC) component 2214, and a memory interface 2215.

The host interface 2211 may provide interfacing between the host 2100 and the SSD 2200 according to a protocol of the host 2100. For example, the host interface 2211 may communicate with the host 2100 through any of the following protocols: SD, USB, MMC, embedded MMC (eMMC), PCMCIA, PATA, SATA, SCSI, SAS, PCI, PCI-E, and UFS. In addition, the host interface 2211 may perform a disk emulating function of supporting the host 2100 to recognize the SSD 2200 as a general-purpose memory system, for example, a hard disk drive (HDD).

The control component 2212 may analyze and process the signal SGL inputted from the host 2100. The control component 2212 may control operations of internal function blocks according to firmware or software for driving the SSD 2200. The random access memory 2213 may be used as a working memory for driving such firmware or software.

The ECC component 2214 may generate parity data of data to be transmitted to the nonvolatile memory devices 2231 to 223n. The generated parity data may be stored, along with the data, in the nonvolatile memory devices 2231 to 223n. The ECC component 2214 may detect errors of data read out from the nonvolatile memory devices 2231 to 223n based on the parity data. When the detected errors are within a correctable range, the ECC component 2214 may correct the detected errors.

The memory interface 2215 may provide control signals such as commands and addresses to the nonvolatile memory devices 2231 to 223n according to control of the control component 2212. The memory interface 2215 may exchange data with the nonvolatile memory devices 2231 to 223n according to control of the control component 2212. For example, the memory interface 2215 may provide data stored in the buffer memory device 2220 to the nonvolatile memory devices 2231 to 223n or provide data read out from the nonvolatile memory devices 2231 to 223n to the buffer memory device 2220.

Figure 9:
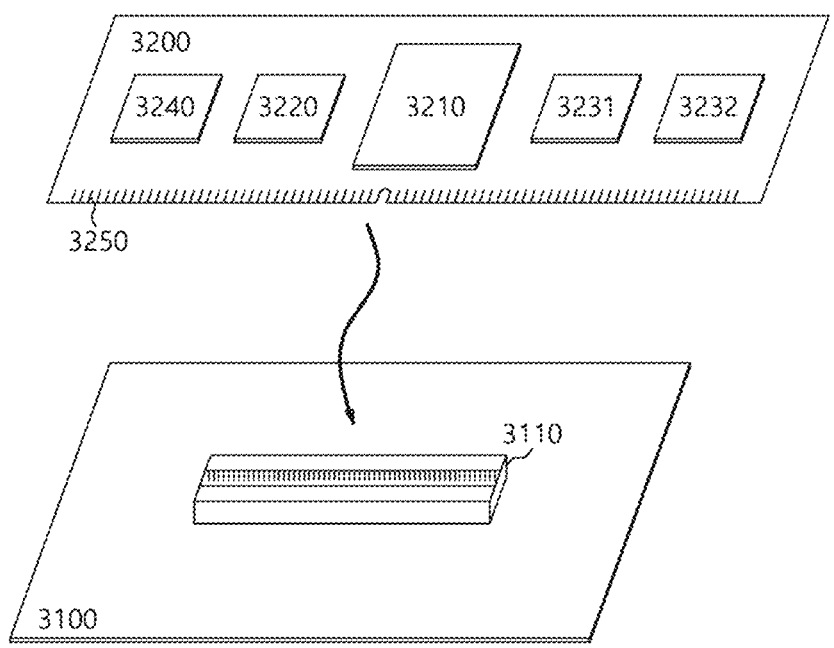
FIG. 9 is a diagram illustrating a data processing system including a memory system according to an embodiment of the present disclosure.

FIG. 9 is a diagram illustrating a data processing system including a memory system according to an embodiment. Referring to FIG. 9, a data processing system 3000 may include a host 3100 and a memory system 3200.

The host 3100 may be configured in the form of a board such as a printed circuit board. Although not shown in FIG. 9, the host 3100 may include internal function blocks for performing functions of the host.

The host 3100 may include a connection terminal 3110 such as a socket, a slot or a connector. The memory system 3200 may be mounted on the connection terminal 3110.

The memory system 3200 may be configured in the form of a board such as a printed circuit board. The memory system 3200 may refer to a memory module or a memory card. The memory system 3200 may include a controller 3210, a buffer memory device 3220, nonvolatile memory devices 3231 and 3232, a power management integrated circuit (PMIC) 3240, and a connection terminal 3250.

The controller 3210 may control overall operation of the memory system 3200. The controller 3210 may be configured in the same manner as the controller 2210 shown in FIG. 8.

The buffer memory device 3220 may temporarily store data to be stored in the nonvolatile memory devices 3231 and 3232. Further, the buffer memory device 3220 may temporarily store data read out from the nonvolatile memory devices 3231 and 3232. The data temporarily stored in the buffer memory device 3220 may be transmitted to the host 3100 or the nonvolatile memory devices 3231 and 3232 according to control of the controller 3210.

The nonvolatile memory devices 3231 and 3232 may be used as storage media of the memory system 3200.

The PMIC 3240 may provide power inputted through the connection terminal 3250, to the inside of the memory system 3200. The PMIC 3240 may manage the power of the memory system 3200 according to control of the controller 3210.

The connection terminal 3250 may be coupled to the connection terminal 3110 of the host 3100. Through the connection terminal 3250, signals such as commands, addresses, data and the like and power may be transferred between the host 3100 and the memory system 3200. The connection terminal 3250 may be configured as any of various types depending on an interface scheme between the host 3100 and the memory system 3200. The connection terminal 3250 may be disposed on or in any side of the memory system 3200.

Figure 10:
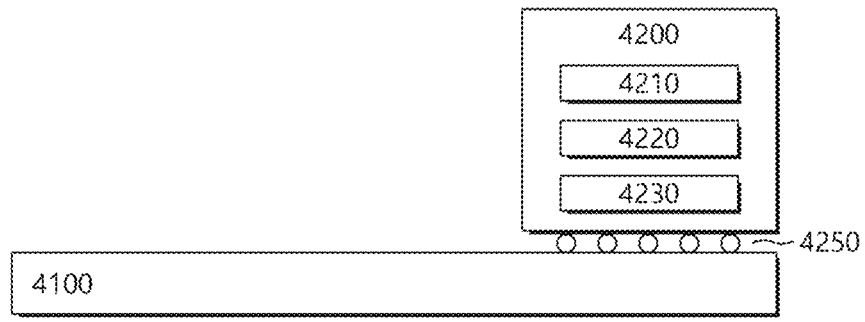
FIG. 10 is a diagram illustrating a data processing system including a memory system according to an embodiment of the present disclosure.

FIG. 10 is a block diagram illustrating a data processing system including a memory system according to an embodiment. Referring to FIG. 10, a data processing system 4000 may include a host 4100 and a memory system 4200.

The host 4100 may be configured in the form of a board such as a printed circuit board. Although not shown in FIG. 10, the host 4100 may include internal function blocks for performing functions of the host.

The memory system 4200 may be configured in the form of a surface-mounting type package. The memory system 4200 may be mounted on the host 4100 through solder balls 4250. The memory system 4200 may include a controller 4210, a buffer memory device 4220, and a nonvolatile memory device 4230.

The controller 4210 may control overall operation of the memory system 4200. The controller 4210 may be configured in the same manner as the controller 2210 shown in FIG. 8.

The buffer memory device 4220 may temporarily store data to be stored in the nonvolatile memory device 4230. Further, the buffer memory device 4220 may temporarily store data read out from the nonvolatile memory device 4230. The data temporarily stored in the buffer memory device 4220 may be transmitted to the host 4100 or the nonvolatile memory device 4230 according to control of the controller 4210.

The nonvolatile memory device 4230 may be used as a storage medium of the memory system 4200.

Figure 11:
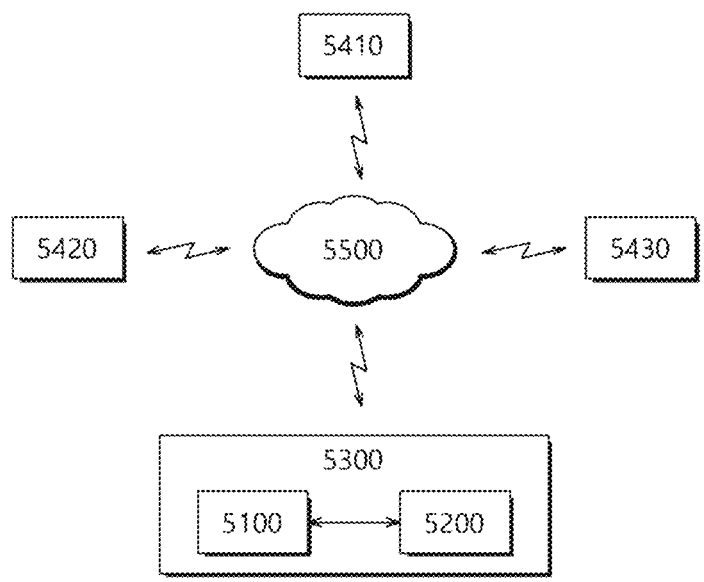
FIG. 11 is a diagram illustrating a network system including a memory system according to an embodiment of the present disclosure.

FIG. 11 is a diagram illustrating a network system 5000 including a memory system according to an embodiment. Referring to FIG. 11, the network system 5000 may include a server system 5300 and a plurality of client systems 5410 to 5430 which are coupled to each other through a network 5500.

The server system 5300 may service data in response to requests from the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host 5100 and a memory system 5200. The memory system 5200 may be configured as the memory system 10 illustrated in FIG. 1, the memory system 2200 illustrated in FIG. 7, the memory system 3200 illustrated in FIG. 9, or the memory system 4200 illustrated in FIG. 10.

Figure 12:
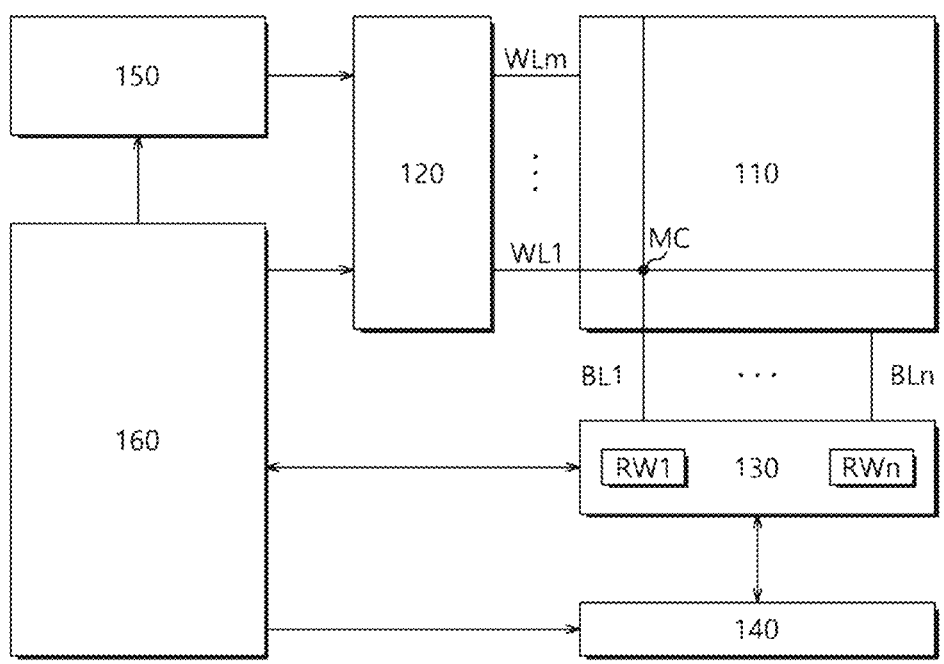
FIG. 12 is a diagram illustrating a nonvolatile memory device included in a memory system according to an embodiment of the present disclosure.

FIG. 12 is a block diagram illustrating a nonvolatile memory device included in a memory system according to an embodiment. Referring to FIG. 12, the nonvolatile memory device 100 may include the memory cell array 110, a row decoder 120, a data read/write block 130, a column decoder 140, a voltage generator 150, and control logic 160.

The memory cell array 110 may include memory cells MC which are arranged in regions where the word lines WL1 to WLm and the bit lines BL1 to BLn intersect.

The row decoder 120 may be coupled with the memory cell array 110 through the word lines WL1 to WLm. The row decoder 120 may operate according to control of the control logic 160. The row decoder 120 may decode addresses provided from an external device (not shown). The row decoder 120 may select and drive the word lines WL1 to WLm, based on the decoding results. For example, the row decoder 120 may provide word line voltages, provided from the voltage generator 150, to the word lines WL1 to WLm.

The data read/write block 130 may be coupled with the memory cell array 110 through the bit lines BL1 to BLn. The data read/write block 130 may include read/write circuits RW1 to RWn corresponding to the bit lines BL1 to BLn. The data read/write block 130 may operate according to control of the control logic 160. The data read/write block 130 may operate as a write driver or a sense amplifier according to an operation mode. For example, the data read/write block 130 may operate as a write driver which stores data provided from the external device, in the memory cell array 110 in a write operation. In another example, the data read/write block 130 may operate as a sense amplifier which reads out data from the memory cell array 110 in a read operation.

The column decoder 140 may operate according to control of the control logic 160. The column decoder 140 may decode addresses provided from the external device. The column decoder 140 may couple data input/output lines (or data input/output buffers) with the read/write circuits RW1 to RWn of the data read/write block 130, which respectively correspond to the bit lines BL1 to BLn, based on decoding results.

The voltage generator 150 may generate voltages to be used in internal operations of the nonvolatile memory device 100. The generated voltages may be applied to the memory cells MC of the memory cell array 110. For example, a program voltage generated in a program operation may be applied to a word line of memory cells on which the program operation is to be performed. In another example, an erase voltage generated in an erase operation may be applied to a well region of memory cells on which the erase operation is to be performed. In still another example, a read voltage generated in a read operation may be applied to a word line of memory cells on which the read operation is to be performed.

The control logic 160 may control overall operation of the nonvolatile memory device 100, based on control signals provided from the external device. For example, the control logic 160 may control operations of the nonvolatile memory device 100 such as read, write, and erase operations of the nonvolatile memory device 100.

The above described embodiments of the present invention are intended to exemplify, not limit, the present invention. Various alternatives and equivalents are possible as those skilled in the art will recognize in light of the present disclosure. The invention is not limited by the embodiments described herein. Nor is the invention limited to any specific type of semiconductor device. Other additions, subtractions, or modifications, to the extent they fall within the scope of the appended claims, are encompassed by the present invention.

What is claimed is:

1. A memory system comprising:
a nonvolatile memory device; and
a controller configured to control the nonvolatile memory device,
wherein the controller is further configured to:
receive a write command for storing write data, currently stored in at least one memory region among a plurality of memory regions in a host memory, in the nonvolatile memory device, generate a host memory map table by mapping virtual addresses to host memory physical addresses corresponding to the at least one memory region, and
transmit the write data to the nonvolatile memory device from the host memory based on the host memory map table,
wherein the controller identifies the at least one memory region in the host memory with reference to the host memory physical addresses.

2. The memory system of claim 1, wherein the controller generates the host memory map table by mapping the virtual addresses to the host memory physical addresses corresponding to a plurality of sub memory regions within the at least one memory region, each of the plurality of sub memory regions having a set size.

3. The memory system of claim 2, wherein the set size is a data size unit to be processed in the memory system.

4. The memory system of claim 2, wherein the nonvolatile memory device includes:
a memory cell array including a plurality of data storage regions; and
a page buffer configured to temporarily store the transmitted write data,
wherein the set size is a data size to be stored in the page buffer.

5. The memory system of claim 2, wherein the controller generates the host memory map table by setting indexes to the host memory physical addresses and mapping the virtual addresses to the set indexes.

6. The memory system of claim 5, wherein the indexes are offset values from the lowest host memory physical address among the host memory physical addresses.

7. The memory system of claim 2,
wherein the write command includes information of a size of the write data and the host memory physical addresses corresponding to the at least one memory region, and
wherein the controller generates the host memory map table based on the information.

8. A controller which controls a nonvolatile memory device, the controller comprising:
a first interface configured to perform data communication with a host;
a second interface configured to perform data communication with the nonvolatile memory device; and
a processor configured to control operations of the first and second interfaces,
wherein the first interface receives, from the host, a write command for storing write data, which is currently stored in at least one among a plurality of memory regions in a host memory,
wherein the processor generates access information corresponding to host memory physical addresses, which respectively correspond to a plurality of sub memory regions within the at least one memory region, each of the plurality of sub memory regions having a set size, in response to the received write command, and
wherein the second interface transmits the write data to the nonvolatile memory device from the host memory based on the access information,
wherein the controller identifies the sub memory regions in the host memory with reference to the host memory physical addresses.

9. The controller of claim 8,
wherein the access information includes a host memory map table.

10. The controller of claim 9, wherein the processor generates the host memory map table by mapping the virtual addresses to the host memory physical addresses corresponding to the plurality of sub memory regions.

11. The controller of claim 8, wherein the set size is a data size unit to be processed in the nonvolatile memory device.

12. The controller of claim 10, wherein the processor generates the host memory map table by setting indexes to the host memory physical addresses and mapping the virtual addresses to the set indexes.

13. The controller of claim 12, wherein the indexes are offset values from the lowest host memory physical address among the host memory physical addresses.

14. The controller of claim 10,
wherein the write command includes information of a size of the write data and the host memory physical addresses corresponding to the plurality of sub memory regions, and
wherein the host memory map table is generated based on the information.

15. A controller which controls a nonvolatile memory device, the controller comprising:
a first interface configured to receive, from a host, a write command for storing write data, which is currently stored in at least one memory region among a plurality of memory regions in a host memory;
a first processor configured to generate a host memory map table by mapping virtual addresses to host memory physical addresses corresponding to the at least one memory region;
a second interface configured to transmit the write data, stored in the at least one memory region, to the nonvolatile memory device; and
a second processor configured to control the second interface to access the at least one memory region based on the host memory map table,
wherein the controller identifies the at least one memory region in the host memory with reference to the host memory physical addresses.

16. The controller of claim 15, wherein the first processor generates the host memory map table by mapping the virtual addresses to the host memory physical addresses corresponding to a plurality of sub memory regions within the at least one memory region, each of the plurality of sub memory regions having a set size.

17. The controller of claim 16, wherein the set size is a data size unit to be processed in the nonvolatile memory device.

18. The controller of claim 16, wherein the first processor generates the host memory map table by setting indexes to the host memory physical addresses and mapping the virtual addresses to the set indexes.

19. The controller of claim 18, wherein the indexes are offset values from the lowest host memory physical address among the host memory physical addresses.

20. The controller of claim 15,
wherein the write command includes information of a size of the write data and the host memory physical addresses corresponding to a plurality of sub memory regions within the at least one memory region, each of the sub memory regions having a set size, and
wherein the first processor generates, based on the information, the host memory map table by mapping the virtual addresses to the host memory physical addresses corresponding to the plurality of sub memory regions.

* * * * *